United States Patent
Lee et al.

(10) Patent No.: US 12,165,901 B2
(45) Date of Patent: *Dec. 10, 2024

(54) SYSTEM AND METHOD FOR RING FRAME CLEANING AND INSPECTION

(71) Applicant: Taiwan Semiconductor Manufacturing Co., Ltd., Hsinchu (TW)

(72) Inventors: Chien-Fa Lee, Hsinchu (TW); Hsu-Shui Liu, Pingjhen (TW); Jiun-Rong Pai, Jhubei (TW); Shou-Wen Kuo, Hsinchu (TW); Jian-Hung Cheng, Hsinchu (TW); M. C. Lin, Hsinchu (TW); C. C. Chien, Hsinchu (TW); Hsuan Lee, Tainan (TW); Boris Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/231,751

(22) Filed: Aug. 8, 2023

(65) Prior Publication Data

US 2023/0386887 A1    Nov. 30, 2023

Related U.S. Application Data

(62) Division of application No. 17/308,786, filed on May 5, 2021, now Pat. No. 11,764,097, which is a division of application No. 15/987,581, filed on May 23, 2018, now Pat. No. 11,004,720.

(51) Int. Cl.
| | |
|---|---|
| *H01L 21/683* | (2006.01) |
| *H01L 21/02* | (2006.01) |
| *H01L 21/304* | (2006.01) |
| *H01L 21/66* | (2006.01) |

(52) U.S. Cl.
CPC .... *H01L 21/6836* (2013.01); *H01L 21/02043* (2013.01); *H01L 21/304* (2013.01); *H01L 22/34* (2013.01); *H01L 2221/68327* (2013.01)

(58) Field of Classification Search
None
See application file for complete search history.

(56) References Cited

U.S. PATENT DOCUMENTS

| | | |
|---|---|---|
| 5,203,360 A | 4/1993 | Nguyen et al. |
| 5,705,016 A | 1/1998 | Senoo et al. |
| 11,004,720 B2 * | 5/2021 | Lee ............... H01L 21/304 |
| 2004/0144487 A1 | 7/2004 | Martinez et al. |
| 2007/0170602 A1 | 7/2007 | Narasimalu et al. |
| 2008/0044258 A1 | 2/2008 | Akechi |
| 2013/0112224 A1 | 5/2013 | Nakaharada et al. |
| 2013/0278693 A1 | 10/2013 | Bellisario |
| 2016/0372305 A1 | 12/2016 | Uemura et al. |

* cited by examiner

*Primary Examiner* — Christopher T Schatz
(74) *Attorney, Agent, or Firm* — Duane Morris LLP

(57) ABSTRACT

A system and method for cleaning ring frames is disclosed. In one embodiment, a ring frame processing system includes: a plurality of blades for mechanically removing tapes and tape residues from surfaces of a ring frame; a plurality of wheel brushes for conditioning the surfaces of the ring frame; and a transport mechanism for transporting the ring frame.

20 Claims, 5 Drawing Sheets

SYSTEM AND METHOD FOR RING FRAME CLEANING AND INSPECTION

CROSS-REFERENCE TO RELATED APPLICATION

This application is a division of U.S. patent application Ser. No. 17/308,786, filed May 5, 2021, which is a division of U.S. patent application Ser. No. 15/987,581, filed May 23, 2018, now U.S. Pat. No. 11,004,720, each of which is incorporated by reference herein in their entireties.

BACKGROUND

A wafer dicing process is typically conducted to separate dies from a semiconductor wafer following various manufacturing processes. During dicing, semiconductor wafers are first mounted, with their active sides up, onto a dicing tape cut to size and fixed to a ring frame. The ring frame and the dicing tape secure the wafer during the dicing process and keep the dies aligned before they are extracted by die-handling equipment for the next manufacturing step, e.g., packaging. Furthermore, semiconductor wafers fixed on ring frames are labeled using barcode tapes on ring frames. Therefore, tapes and tape residues from dicing tapes and barcode tapes need to be removed from ring frames before they can be used again for a next batch of wafer dicing.

Traditionally, tapes and tape residues are removed based on a chemical method using acid and alcohol. This technique is not environmental-friendly (e.g., generating large amount of acid waste) and not techno-economically feasible (e.g., large amounts of chemicals are needed). After cleaning, ring frames are inspected manually by a human using an optical instrument to determine the presence of residues in the form of particles. When tape residues are detected as a result of such "manual" inspection, the ring frame is generally removed for re-cleaning before it can be re-used. Such a manual inspection disadvantageously causes various issues. For example, a time-resource trade-off leads to a trade-off between an inspection resolution and a sampling rate, e.g., a high sampling rate (i.e., a high throughput of the inspection) is typically subjected to a low inspection resolution, and vice versa.

Therefore, a method and system that can effectively clean ring frames and can automatically determine the cleanness of the ring frames at high resolution is needed. Despite this long felt need, no suitable systems meeting these requirements are available.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

Figure 1A:
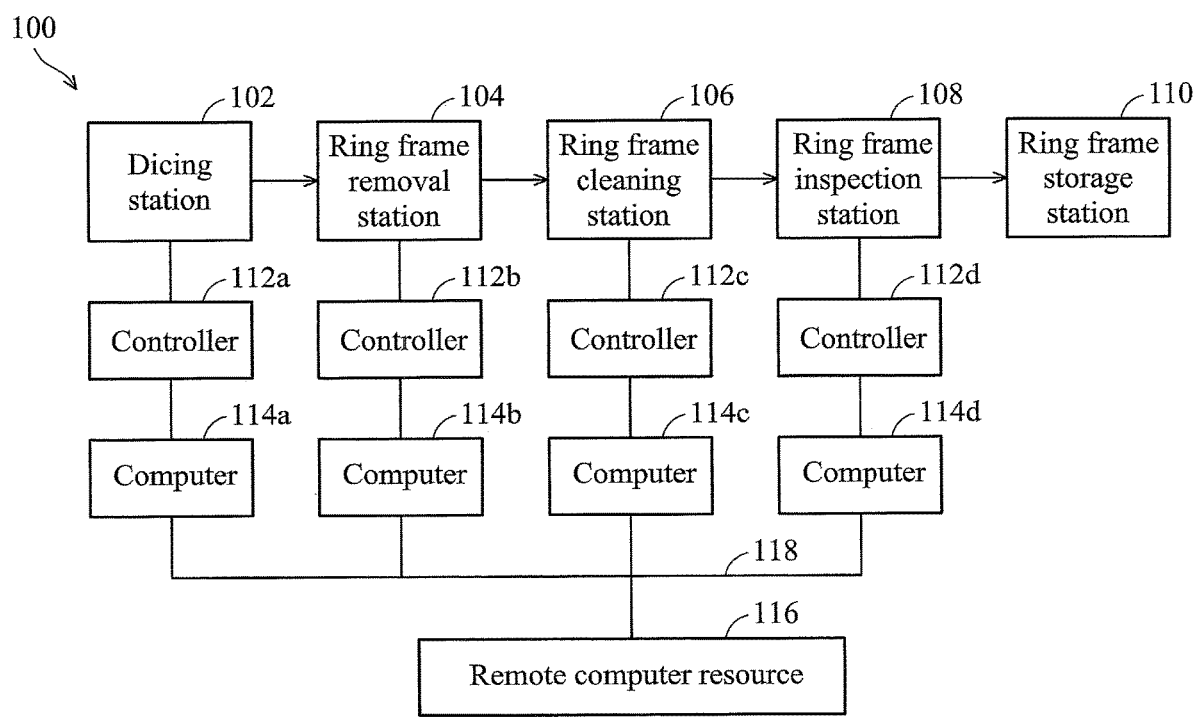
FIGS. 1A-1B illustrate a system for cleaning and inspecting ring frames, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The presented disclosure provides various embodiments of a method and system for cleaning and inspecting ring frames. Ring frames widely used in wafer dicing processes need to be cleaned to remove adhesive residues from tapes, for example barcode tapes and dicing tapes, before they can be re-used. In contrast to the traditional chemical cleaning methods, as described above, a system and method to effectively remove adhesive residues based on a mechanical method using blades and wheel brushes is presented. Furthermore, a high-throughput and automated optical inspection system is used to replace manual inspection and to automatically detect the cleanness of the ring frames after cleaning. Accordingly, the above-mentioned issues may be advantageously avoided.

The description of the exemplary embodiments herein is to be understood in connection with the figures of the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIG. 1A illustrates a system 100 for cleaning and inspecting ring frames, in accordance with some embodiments of the present disclosure. It is noted that the system 100 is merely an example, and is not intended to limit the present disclosure. Accordingly, it is understood that additional operations may be provided before, during, and after the system 100 of FIG. 1, and that some other operations may only be briefly described herein.

Referring to FIG. 1, the system 100 comprises a plurality of processing stations 102, 104, a ring frame cleaning station 106, a ring frame inspection station 108, and a ring frame storage station 110. In some embodiments, the processing station 102 is a wafer dicing station and the processing station 104 is a ring frame removal station. At least one die from a semiconductor wafer can be created in the processing station 102.

The wafer dicing process conducted in the processing station 102 is a process by which dies are separated from a semiconductor wafer following IC manufacturing processes including cleaning, photolithography, wet etching, dry etching, dielectric deposition, metal deposition, and any semiconductor processes known in the art. In some embodiments, the dicing process can involve scribing and breaking, mechanical sawing or laser cutting. In some embodiments, the wafer dicing process is a tape-based process. During a tape-based process, before dicing, a wafer is first mounted with active side up onto a dicing tape cut to size and fixed to a ring frame. In some embodiments, the wafer can be applied to the dicing tape with controlled temperature and pressure. In some embodiments, the ring frame comprises stainless steel. This configuration secures the wafer during the dicing process and keeps dies aligned for easy transport to the next step in the process, e.g., packaging. After dicing, the dies stay on the dicing tape until they are extracted by automated die-handling equipment.

Various dicing tapes with different properties can be used depending on the dicing application. UV curable tapes are used for smaller die sizes and non-UV dicing tape for large die sizes according to some embodiments. In some embodiments, the dicing tapes can be made of polyolefin, polyethylene, polyvinyl chloride (PVC) backing material with adhesives in order to hold the dies in place. In some embodiments, the dicing tapes can have a thickness from 75 micrometers to 150 micrometers, with a variety of adhesive strengths, designed for various chip sizes and materials.

In some embodiments, the processing station 102 also comprises a UV curing station when UV tapes are used as dicing tapes. UV tapes have adhesive bond that can be broken by exposure to UV light, allowing the adhesive to be stronger during cutting while allowing clean and easy removal. In some embodiments, the UV curing station has adjustable UV irradiation power levels for different UV tapes with different adhesive strength. In some embodiments, the UV power level is high to complete cure the adhesive and to completely remove adhesive residues. In some embodiments, the processing station 102 further comprises a heating station when thermal-release tapes are used as dicing tapes. Thermal-release tapes have adhesive bonds that can be broken by heat irradiation. When heat is applied, the tape releases its adhesion on the dies. In some embodiments, the dicing tape can be an electrostatic discharge tape to reduce contamination for highly sensitive applications.

In some embodiments, the processing station 102 can further comprise an automated die picking machine to remove dies after dicing from the cured dicing tape for storage or bonding into a package. In some embodiments, the automated die picking machine can use poker pin to push dies for removal. In some embodiments, the automated die picking machine can also use vacuum to draw away dies from the dicing tape. In some other embodiments, the automated die picking machine can use a mechanical tweezer or gripper to remove dies from the dicing tape. In some embodiments, the automated die picking machine can use a combination of different techniques to separate dies from the dicing tape. In some embodiments, the processing station 102 further comprises a die matrix expander, which applies forces on the dicing tape to expend the space between dies allowing an insertion of mechanical tweezers or grippers to remove dies from the dicing tape.

Figure 1B:
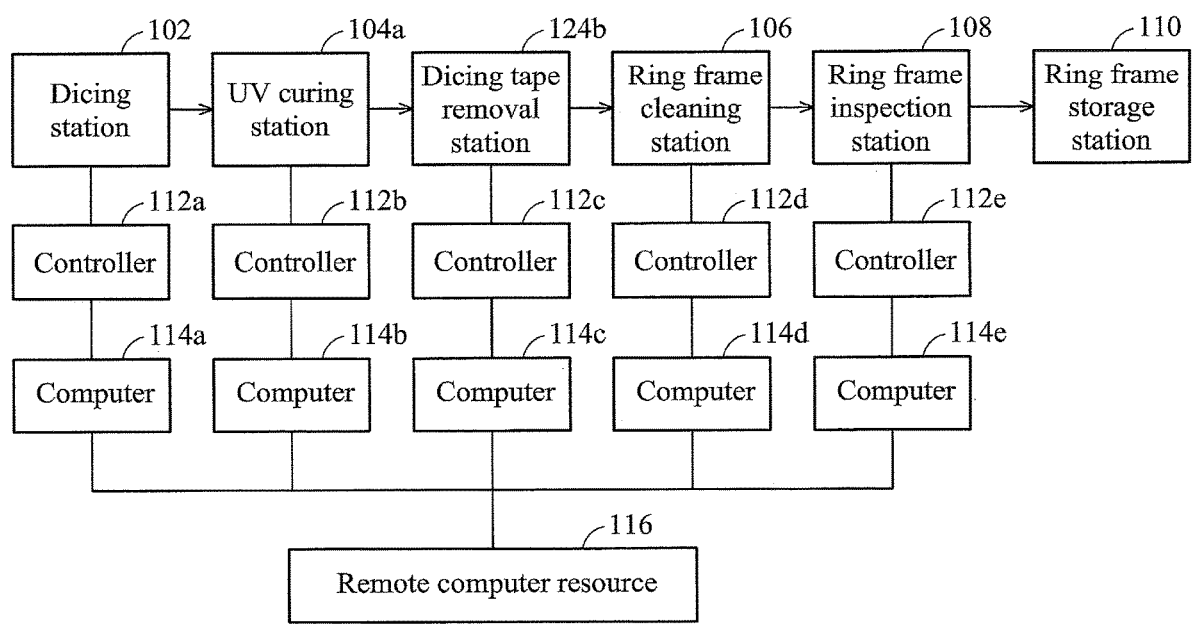

Ring frame removal process conducted in the processing station 104 is a process after wafer dicing and removing dies from the dicing tape to prepare ring frames for a next batch of wafer dicing. In some embodiments, the processing station 104 comprises an automated UV tape removal system, in which a UV light is used on the backside of the ring frame to cure the adhesive of the dicing tape on the ring frame allowing an easy removal of dicing tape from the ring frame. The dicing tape can then be peeled off from the ring frame using a peeling tape or a blade, according to certain embodiments. In some embodiments, the automated UV curing process and dicing tape removal process performed in the ring frame removal processing station are performed separately in separated processing stations, including a UV curing station 104a and a dicing tape removal station 104b (as shown in FIG. 1B).

Ring frame cleaning station (hereinafter "cleaning station") 106 is used to clean ring frames used to support wafers during the dicing process and can be configured based on a contact cleaning method. Adhesive residues from the dicing tape on the back surface of the ring frame as well as a barcode tape on the front surface of the ring frame have to be cleaned before the ring frame can be used again. Typically, a chemical-based cleaning method is generally used, during which a lot of acidic chemicals and alcohol can be consumed and wasted. Therefore, this traditional method is not environmental-friendly and techno-economically feasible. As discussed in further detail below, in some embodiments, a barcode tape on the opposite surface of the dicing tape as a wafer identification can be first removed mechanically using a blade. In some embodiment, the ring frame cleaning station 106 comprises a mechanical copper wire wheel brush to remove the barcode tape residues. In some embodiments, the cleaning station 106 comprises a substantially vertical rotary mechanism. The cleaning elements and processes performed in the ring frame cleaning station 106 is further discussed in detail in FIG. 2.

Ring frame inspection station (hereinafter "inspection station") 108 comprises an automated optical inspection system, in accordance with some embodiments. As discussed in further detail below, in some embodiments, the inspection station 108 includes a ring frame transport system (e.g., a conveyor) that transfers a ring frame through the inspection station, a line scan camera, a controller, and a local computer with a storage unit and a display unit. For example, the cleaned ring frame can be transferred on a conveyor in the inspection system 108 from a ring frame cleaning station 106 to a ring frame storage station 110a, or if an unsatisfied cleanness is detected (e.g., tape residues) on the ring frame, to respective storage station 110b, which are collectively referred to storage station 110. While being transferred in the inspection system 108, both surfaces of the ring frame is imaged by at least one line scan camera. Data collected by the line scan camera can be stored in a storage unit of a local computer 114d followed by a preprocessing step. Examples of preprocessing can include reconstruction of the line images into a two-dimensional image of the ring frame surface and various distortion corrections, as described in further detail below.

Each process station 102, 104, 106, and 108 is coupled to a local computer 114a, 114b, 114c, and 114d through controllers 112a, 112b, 112c, and 112d, respectively, in accordance with some embodiments. The controllers are generally or collectively referred to controllers 112a-d herein. The local computers are generally or collectively referred to local computer(s) 114 herein. The local computers 114a-d are each coupled to a remote computer resource 116 through a connection 118. In some embodiments, the connection 118 may include a Ethernet cable, an optical fiber, a wireless communication media, and/or other networks known in the art. It should be understood that other connections and intermediate circuits can be deployed between the local computers 114 and the remote computer resource 116 to facilitate interconnection.

In some embodiments, an image processing operation can be performed by the remote computer resource 116 to automatically detect the cleanness of the ring frame in accordance with predetermined algorithms or rules concerning, e.g., irregular shapes, and the like. In some embodiments, the remote computer resource 116 includes a computer network, servers, applications, and/or data centers, generally known as the "cloud" or cloud computing. Results and decisions from the remote computer resource 116 about whether the wafer contains defects are processed and transmitted back to the local computer 114d associated with the inspection system 108 through the connection 118. In some embodiments, the remote computer resource 116 may be unnecessary if the local computer 114d can perform the image processing and analysis locally. In some embodiments, various inspection results (e.g., size, density and distribution of particles and mapping of residues) are displayed on a local display unit and a control signal is sent to the conveyor to transfer the ring frame to a respective storage station 110a. In some embodiments, a ring frame that fails to meet a pre-defined threshold or criterion, and thus determined to be unclean, is transferred by the conveyor in the inspection system 108 to a cassette in the storage station 110b for re-cleaning. On the other hand, if the ring frame is determined to be clean meeting the pre-defined threshold or criterion, then it is transferred by the conveyor to the ring frame storage station 110a, which are used in a next wafer dicing process (e.g., dicing tape attachment, wafer alignment and mounting, wafer scanning and dicing, etc.). In some embodiments, the threshold may vary depending on the application (e.g., type of tapes used and conditions used for removing them) and can be set by manufacturers.

In some embodiments, a separate transfer chamber can be coupled to the cleaning station 106. In some embodiments, the inspection station 108 may be configured inside the cleaning station 106, if the process does not interfere with the inspection. Such an integration of the inspection station to the cleaning station provides an automated inspection that can efficiently detect the cleanness of the ring frames after cleaning, without relying on manual inspection or statistical sampling of the ring frame surfaces. By mapping the particles/residues on the surfaces of the ring frame after cleaning, as part of the inspection process, critical insights into process characteristics (e.g., cleaning tools and conditions) at each cleaning stage can be obtained while minimizing adverse effects on throughput.

Figure 2:
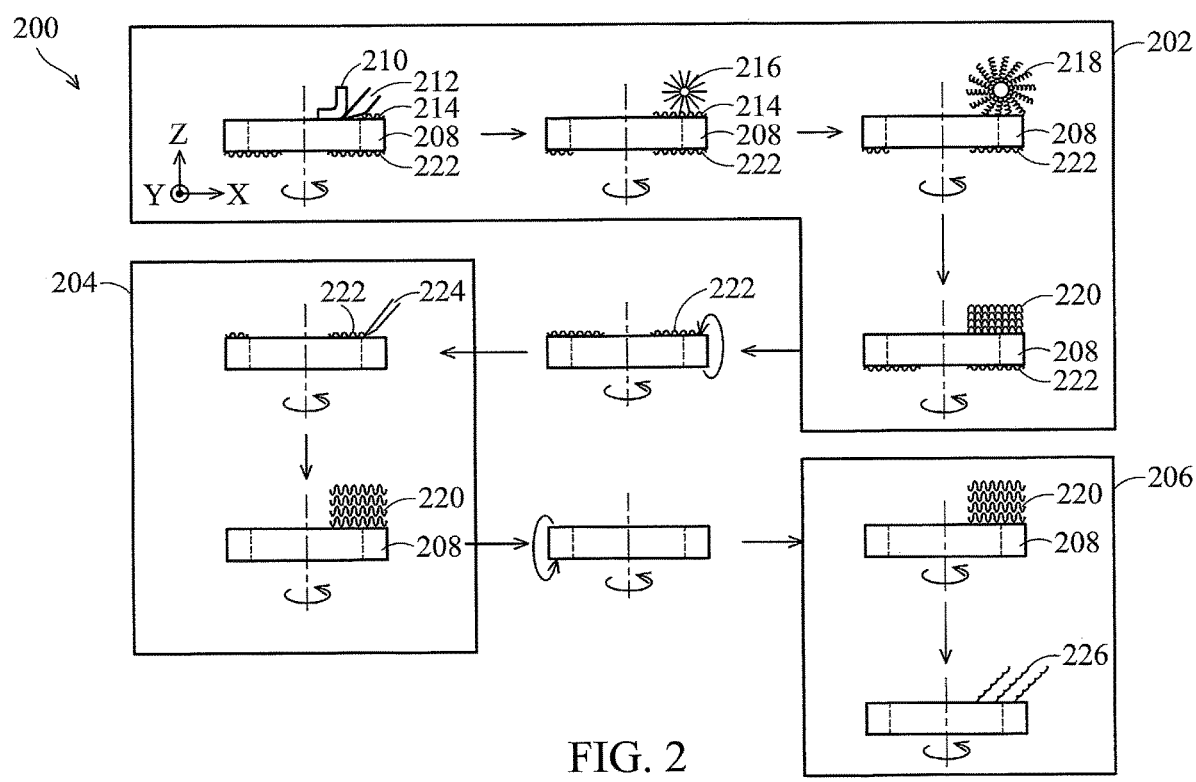
FIG. 2 illustrates a cross-sectional overview of a plurality of cleaning elements in a ring frame cleaning station, in accordance with some embodiments of the present disclosure.

FIG. 2 illustrates a cross-sectional overview of a plurality of cleaning elements in a ring frame cleaning station 200, in accordance with some embodiments of the present disclosure. The ring frame cleaning station (hereinafter "cleaning station") 200 comprises a front surface cleaning stage 202, a back surface cleaning stage 204, and a final cleaning stage 206. In some embodiments, the ring frame 208, during cleaning, secured by a suitable ring frame holder (not shown) coupled to a conveyor, e.g., a motorized robotic transfer arm (not shown). The robotic transfer arm is translatable in both the X, Y, and Z directions to move between cleaning elements (blade 212, wire wheel brush 216, non-woven wheel brush 218, and dust-free cloth 220). In some embodiments, the robotic transfer arm is also rotatable about a certain center in the X-Y plane along the Z axis. In illustrated embodiment, the ring frame 208 rotates along the Z axis at a constant speed during cleaning.

In some embodiments, the front surface cleaning stage 202 comprises removing a barcode tape 210 on a ring frame 208 using a blade 212. In the illustrated embodiment, this removing process leaves adhesive residues 214 on the front surface of the ring frame 208. In some embodiments, the ring frame 208 comprises stainless steel and the blade 212 comprises materials that have a mechanical hardness that is smaller than that of the ring frame 208. In some embodiments, the blade 212 comprises aluminum. A relative movement between the blade 212 and the front surface of the ring frame 208 and a contact force are configured and feed-back controlled by the control circuit 112c (FIG. 1) allowing a mechanical removal of the barcode tape 210 without using chemicals and meanwhile without causing mechanical damage to the front surface of the ring frame.

After the removal of barcode tape 210, the ring frame 208 is further cleaned using at least one wire wheel brush 216 to remove the tape residue 214. In some embodiments, the wire wheel brush 216 comprises a circular abrasive brush. In some embodiments, the wires can comprise metal wires with small diameters for fine removal of tape residues 214. In some embodiments, the wires can be made of copper, copper alloys, e.g., bronze, brass, etc, and a combination thereof. In some embodiments, the tape residue 214 can be cleaned by a plurality of wire wheel brushes 216 with different diameters for coarse and fine removal of tape residues 214. In certain embodiments, the wires in the wire wheel brushes 216 comprise materials that have a hardness that are less than the hardness of the material of the ring frame 208. For example, copper wires have a hardness of 75-120 Vickers Pyramid Number (HV) and stainless steel ring frame has a hardness of 250-310 HV.

After brush cleaning using at least one wire wheel brush 216, the front surface of the ring frame 208 is further conditioned using a non-woven wheel brush 218, in accordance with some embodiments. In some embodiments, the non-woven wheel brush 218 for surface conditioning comprises materials such as, for example aluminum oxide, silicon carbide, and ceramic, as the abrasive materials. In some embodiments, the non-woven wheel brush 218 can comprise a sanding pad or disc. In some embodiments, the non-woven wheel brush 218 comprises non-woven fabrics, including synthetic materials, natural materials or combinations thereof. In some embodiments, the conditioning using the non-woven wheel brush 218 can be performed under a wet condition, e.g., water. The front surface cleaning of the ring frame 208 is then finished by wiping the front surface with a dust-free cloth 220, such as under wet conditions, according to some embodiments.

The back surface cleaning of the ring frame 208 is then performed. The ring frame 208 is first flipped by a robotic arm during the transfer of the ring frame 208 between the front surface cleaning stage 202 and the back surface cleaning stage 204, in accordance with some embodiments. To remove the dicing tape residue 222 from a previous dicing tape removal process in the ring frame removal station 104, a blade 224 can be used to gently slide along the back surface of the ring frame 208, according to some embodiments. In some embodiments, the blade 224 comprises a thermoplastic polymer. In some embodiments, the blade 224 comprises a material that has a smaller hardness than that of the ring frame 208. In some embodiments, the blade 224 is made of polyaryletherketone (PAEK), such as polyether ether ketone (PEEK). PEEK offers high strength and excellent resistance to high temperatures allowing an application of heating during the removal of tape residues 222, in some embodiments. Furthermore, PEEK offers high abrasive wear resistance. The blade 224 made of PEEK can be manufactured using an injection molding or a machining process due to the great processability of the PEEK material. In some embodiments, the PEEK blade 224 can further comprise carbon fiber, glass fiber, PTFE (polytetrfaluoroethylene) or PEK (polyether ketone) for improved mechanical or thermal properties. The back surface cleaning stage 204 is then accomplished by wiping the back surface with a dust-free cloth 220 under wet conditions.

A final cleaning stage 206 is then gently applied on both front and back surfaces of the ring frame 208 by wiping again with a dust-free cloth 220 and drying both surfaces with a clean dry air 226. In some embodiments, the ring frame 208 is rotated while being dried with clean air.

As discussed separately in detail below, in some embodiments, a control circuit 112 is used to control the transfer arm, position and movement of various cleaning elements and the ring frame holder (e.g., blade 212, wire wheel 216, non-woven wheel 218, PEEK blade 224 and dust-free cloth 220). In some embodiments, the movement of the various cleaning elements includes engagement of the cleaning elements to the surface of the ring frame, direction and speed of the cleaning elements, etc.

Figure 3:
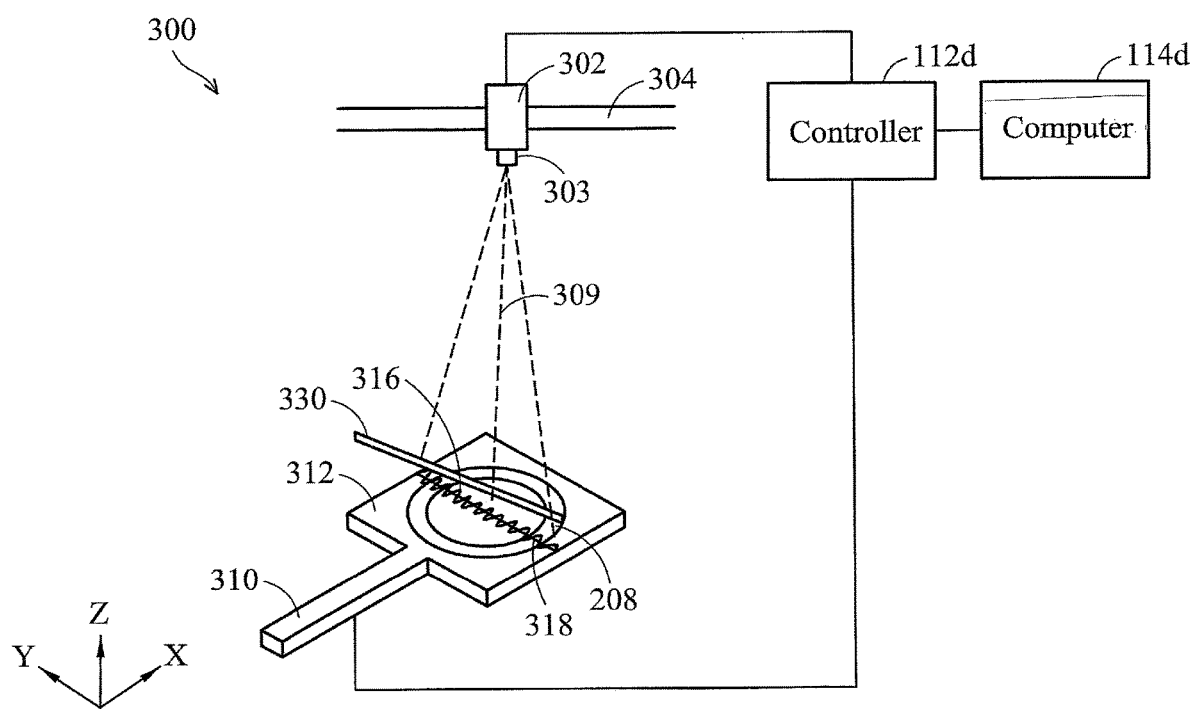
FIG. 3 illustrates a ring frame inspection station, in accordance with some embodiments of the present disclosure.

FIG. 3 illustrates a ring frame inspection station 300, in accordance with some embodiments of the present disclosure. These are, of course, merely examples and are not intended to be limiting. In one embodiment, a ring frame 208 is secured by a suitable holder 312 coupled to a conveyor, e.g., a motorized robotic transfer arm 310. The robotic transfer arm 310 is translatable in both the X and Y directions. In some embodiments, the robotic transfer arm 310 is also rotatable about a certain center in the X-Y plane. In the illustrated embodiment, the holder 312 coupled to the robotic transfer arm 310 transfers the ring frame 208 along the X axis at a constant speed during inspection.

In the embodiment shown in FIG. 3, a line scan camera 302 with an imaging lens 303 is mounted on a frame 304 located at a certain working distance 309 from the surface of the ring frame 208 in the vertical (Z) direction. In some embodiments, these three parts, i.e., 302, 303 and 304, are stationary. In some embodiments, a diffused illumination from a remotely located light source (not shown) can be used, which can provide sufficient light for the line scan camera 302 to capture high-resolution images of the ring frame 208. In some embodiments, the position of the ring frame 208 and the line scan camera 302 relative to the ring frame 208 can be adjusted for alignment purpose. In some embodiments, two line scan cameras 302 can be configured to simultaneously scan the front and back surfaces of the ring frame 208. In some embodiments, the front and back surfaces of the ring frame 208 can be imaged separately by one line scan camera 302.

In some embodiments, instead of capturing an image of the entire ring frame 208 as a whole, the line scan camera 302 collects image data one scan line at a time. An image line 316, indicated by a short dashed line in FIG. 3, is a line region where the reflected or scattered light from the surface of the ring frame 208 under inspection is collected by a light sensor in the line scan camera 302 through the imaging lens 303. In some embodiments, the field of view 318 of the line scan camera 302 in the Y direction, e.g., the maximum length of the image line 312, can be adjusted by the width of the light sensor in the line scan camera 302, the working distance 309, and the focal length of the lens 303. In some embodiments, the image line 316 is the overlap portion of the field of view 318 in Y direction and the surface of the ring frame 208. For example, the width of imaging lens can be 25 millimeters (mm), which can provide a field of view 318 with a width of up to 215 mm in the Y direction and a sensor width of 14 mm. Therefore, the resolution in the Y direction, which has a unit in mm per pixel for a light sensor width of 1024 pixels per line, can be controlled by the working distance 309 taking into account the diameter of the ring frame 208.

In some embodiments, the line scan camera 302 includes a light sensor that can be based on a variety of technologies such as, for example, a charge-coupled detector (CCD), a complementary metal-oxide-semiconductor (CMOS), or a hybrid CCD/CMOS architecture. In some embodiments, the light sensor can be a mono or color sensor. In some embodiments, such light sensor can be configured to either work in a broad range of wavelengths or a narrow range of wavelengths. In some other embodiments, such light sensor can be configured to receive either reflected and/or scattered non-fluorescence light from a light source or a fluorescence light emitted by the defects or features due to an excitation by the light source.

Because of the requirement for a wide field of view 318, when a large ring frame 208 is inspected especially within a limited space, a uniform intensity from a flood light source illumination becomes difficult. As mentioned above, since the image line 316 is the only portion of the ring frame 208 that needs to be uniformly illuminated for collecting line-scan images by the line scan camera 302, the illumination to the image line 316 can be from a line light source 330 having a narrow slit to direct a light beam. In some embodiments, the line light source 330 can include an array of light emitting diodes (LEDs) with a half bar converging line lens as an optical guide. Such a light source may be configured in the limited space while maintaining a uniform illumination to the image line 316 on the ring frame 208. However, in accordance with various embodiments, various light sources suitable for various applications may be utilized. In another embodiment, an imaging lens 303 with a larger diameter, a smaller focal length, and/or a large refractive index can be used to provide a wide field of view 318 at a small working distance 309. To obtain a comparable resolution (mm per pixel) to that on a smaller ring frame 208, a line scan camera with a larger sensor size may be used. In some embodiments, the optical pathway can be redirected by a reflective mirror or a plurality of reflective mirrors e.g., an array of reflective mirrors (not shown) to accommodate the inspection system in certain applications.

In some embodiments, the relative position between the line scan camera 302 and the light source 330 can affect the inspection criteria. For example, in case of using a linear light source 330 on a ring frame 208 with a reflective surface, when the line scan camera 302 is off the angle of reflection, the reflective surface appears dark in the light sensor while the features and/or defects can scatter light and appear bright in the image. For another example, when the line scan camera 302 is within the angle of reflection of the incident light from the light source 330, the surface appears bright while the features and/or defects may appear darker or brighter depending on their reflectivity relative to the rest of the surface.

In some embodiments, the conveyor can be a transfer robot which consists of multiple joints, a single arm, and a stage. In some embodiments, the transfer robot can provide high-speed and high-accuracy wafer handling within a limited space. As discussed above, a surface inspection using the line scan camera 302 requires a linear motion of the ring frame 208 in a direction perpendicular to the axis of the image line 316.

As the ring frame 208 enters the field of view 318 in Y direction, a recording cycle of a line scan image from the line scan camera 302 by a local computer 114*d* is initiated. In some embodiments, the recording can be also initiated by a position signal from an encoder that is located on a motor of the robotic transfer arm 310. In some embodiments, image data as the scanning progresses is shown on a display monitor coupled to the local computer 114d.

In some embodiments, such recording process of one single line of pixel from the line scan camera 302 to the local computer 114d is conducted in two steps, i.e., exposure and readout steps. In the first step, the line scan camera 302 collects a single line of pixels per exposure at one position which is initiated by the application of a trigger pulse to the camera, as discussed above. The trigger pulse also ends the exposure period and starts the second step of transferring the sensor image information to a readout register and finally out of the camera to the local computer, to complete the readout step. In some embodiments, the sensor image information is provided to the local computer 114d one line of pixels at a time.

In some embodiments, the exposure time of an individual line at the image line 312 and the number of lines can be affected by the velocity of the ring frame 208 and resolution requirement along the X axis in the wafer plane. In some embodiment, the exposure time may also be affected by illumination intensity, sensitivity of the light sensor, and residues being detected. In parallel with the first readout period, the line scan camera 302 continues with the next exposure step in a next cycle, while the robotic transfer arm 310 moves the ring frame 208 to the next position.

In some embodiments, reconstruction of the image of the front and back surfaces of the ring frame 208 under inspection is conducted based on a plurality of single line images through the local computer 114d and the surface images are then displayed on the display unit in real time.

Once the surfaces of the ring frame under inspection have been completely scanned, the local computer 114d then proceeds to reconstruct and preprocess the complete two-dimensional surface image to prepare the image for cleanness detection. In some embodiments, such preprocessing of the surface image includes offset correction, gain correction, distortion correction, adjusting contrast, and the like. In accordance with some embodiments, the reconstructed image is displayed on the display unit of the local computer 114d.

As discussed above in FIGS. 1 and 2, the control circuit 112 is a representative device and may comprise a processor, a memory, an input/output interface, a communications interface, and a system bus. The processor may comprise any processing circuitry operative to control the operations and performance of the control circuits 112 of the system 100. In various aspects, the processor may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor also may be implemented by a controller, a microcontroller, an application specific integrated circuit (ASIC), a field programmable gate array (FPGA), a programmable logic device (PLD), and so forth.

In various aspects, the processor may be arranged to run an operating system (OS) and various applications. Examples of an OS comprise, for example, operating systems generally known under the trade name of Apple OS, Microsoft Windows OS, Android OS, and any other proprietary or open source OS. Examples of applications comprise, for example, a telephone application, a camera (e.g., digital camera, video camera) application, a browser application, a multimedia player application, a gaming application, a messaging application (e.g., email, short message, multimedia), a viewer application, and so forth.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in the memory.

In some embodiments, the memory may comprise any machine-readable or computer-readable media capable of storing data, including both volatile/non-volatile memory and removable/non-removable memory. The memory may comprise at least one non-volatile memory unit. The non-volatile memory unit is capable of storing one or more software programs. The software programs may contain, for example, applications, user data, device data, and/or configuration data, or combinations therefore, to name only a few. The software programs may contain instructions executable by the various components of the control circuits 112 of the system 100.

For example, memory may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory may contain an instruction set, in the form of a file for executing a method of generating one or more timing libraries as described herein. The instruction set may be stored in any acceptable form of machine-readable instructions, including source code or various appropriate programming languages. Some examples of programming languages that may be used to store the instruction set comprise, but are not limited to: Java, C, C++, C#, Python, Objective-C, Visual Basic, or .NET programming. In some embodiments a compiler or interpreter is comprised to convert the instruction set into machine executable code for execution by the processor.

In some embodiments, the I/O interface may comprise any suitable mechanism or component to at least enable a user to provide input to the control circuits 112 of the system 100 and the control circuits 112 to provide output to the user. For example, the I/O interface may comprise any suitable input mechanism, including but not limited to, a button, keypad, keyboard, click wheel, touch screen, or motion sensor. In some embodiments, the I/O interface may comprise a capacitive sensing mechanism, or a multi-touch capacitive sensing mechanism (e.g., a touchscreen).

In some embodiments, the I/O interface may comprise a visual peripheral output device for providing a display visible to the user. For example, the visual peripheral output device may comprise a screen such as, for example, a Liquid Crystal Display (LCD) screen, incorporated into the control circuits 112 of the system 100. As another example, the visual peripheral output device may comprise a movable display or projecting system for providing a display of content on a surface remote from the control circuits 112 of the system 100. In some embodiments, the visual peripheral output device can comprise a coder/decoder, also known as a Codec, to convert digital media data into analog signals. For example, the visual peripheral output device may comprise video Codecs, audio Codecs, or any other suitable type of Codec.

The visual peripheral output device also may comprise display drivers, circuitry for driving display drivers, or both. The visual peripheral output device may be operative to display content under the direction of the processor. For example, the visual peripheral output device may be able to play media playback information, application screens for applications implemented on the control circuits 112 of the system 100, information regarding ongoing communications operations, information regarding incoming communications requests, or device operation screens, to name only a few.

In some embodiments, the communications interface may comprise any suitable hardware, software, or combination of hardware and software that is capable of coupling the control circuits 112 of the system 100 to one or more networks and/or additional devices. The communications interface may be arranged to operate with any suitable technique for controlling information signals using a desired set of communications protocols, services or operating procedures. The communications interface may comprise the appropriate physical connectors to connect with a corresponding communications medium, whether wired or wireless.

Systems and methods of communication comprise a network, in accordance with some embodiments. In various aspects, the network may comprise local area networks (LAN) as well as wide area networks (WAN) including without limitation Internet, wired channels, wireless channels, communication devices including telephones, computers, wire, radio, optical or other electromagnetic channels, and combinations thereof, including other devices and/or components capable of/associated with communicating data. For example, the communication environments comprise in-body communications, various devices, and various modes of communications such as wireless communications, wired communications, and combinations of the same.

Wireless communication modes comprise any mode of communication between points (e.g., nodes) that utilize, at least in part, wireless technology including various protocols and combinations of protocols associated with wireless transmission, data, and devices. The points comprise, for example, wireless devices such as wireless headsets, audio and multimedia devices and equipment, such as audio players and multimedia players, telephones, including mobile telephones and cordless telephones, and computers and computer-related devices and components, such as printers, network-connected machinery, and/or any other suitable device or third-party device.

Wired communication modes comprise any mode of communication between points that utilize wired technology including various protocols and combinations of protocols associated with wired transmission, data, and devices. The points comprise, for example, devices such as audio and multimedia devices and equipment, such as audio players and multimedia players, telephones, including mobile telephones and cordless telephones, and computers and computer-related devices and components, such as printers, network-connected machinery, and/or any other suitable device or third-party device. In various implementations, the wired communication modules may communicate in accordance with a number of wired protocols. Examples of wired protocols may comprise Universal Serial Bus (USB) communication, RS-232, RS-422, RS-423, RS-485 serial protocols, FireWire, Ethernet, Fiber Channel, MIDI, ATA, Serial ATA, PCI Express, T-1 (and variants), Industry Standard Architecture (ISA) parallel communication, Small Computer System Interface (SCSI) communication, or Peripheral Component Interconnect (PCI) communication, to name only a few examples.

Accordingly, in various aspects, the communications interface may comprise one or more interfaces such as, for example, a wireless communications interface, a wired communications interface, a network interface, a transmit interface, a receive interface, a media interface, a system interface, a component interface, a switching interface, a chip interface, a controller, and so forth. When implemented by a wireless device or within wireless system, for example, the communications interface may comprise a wireless interface comprising one or more antennas, transmitters, receivers, transceivers, amplifiers, filters, control logic, and so forth.

In various embodiments, the communications interface may provide voice and/or data communications functionality in accordance a number of wireless protocols. Examples of wireless protocols may comprise various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may comprise various wireless wide area network (WWAN) protocols, such as GSM cellular radiotelephone system protocols with GPRS, CDMA cellular radiotelephone communication systems with 1×RTT, EDGE systems, EV-DO systems, EV-DV systems, HSDPA systems, and so forth. Further examples of wireless protocols may comprise wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may comprise near-field communication techniques and protocols, such as electromagnetic induction (EMI) techniques. An example of EMI techniques may comprise passive or active radio-frequency identification (RFID) protocols and devices. Other suitable protocols may comprise Ultra Wide Band (UWB), Digital Office (DO), Digital Home, Trusted Platform Module (TPM), ZigBee, and so forth.

In some embodiments, the control circuits 112 of the system 100 may comprise a system bus that couples various system components including the processor, the memory, and the I/O interface. The system bus can be any of several types of bus structure(s) including a memory bus or memory controller, a peripheral bus or external bus, and/or a local bus using any variety of available bus architectures including, but not limited to, 9-bit bus, Industrial Standard Architecture (ISA), Micro-Channel Architecture (MCA), Extended ISA (EISA), Intelligent Drive Electronics (IDE), VESA Local Bus (VLB), Personal Computer Memory Card International Association (PCMCIA) Bus, Small Computer System Interface (SCSI) or other proprietary bus, or any custom bus suitable for computing device applications.

Figure 4:
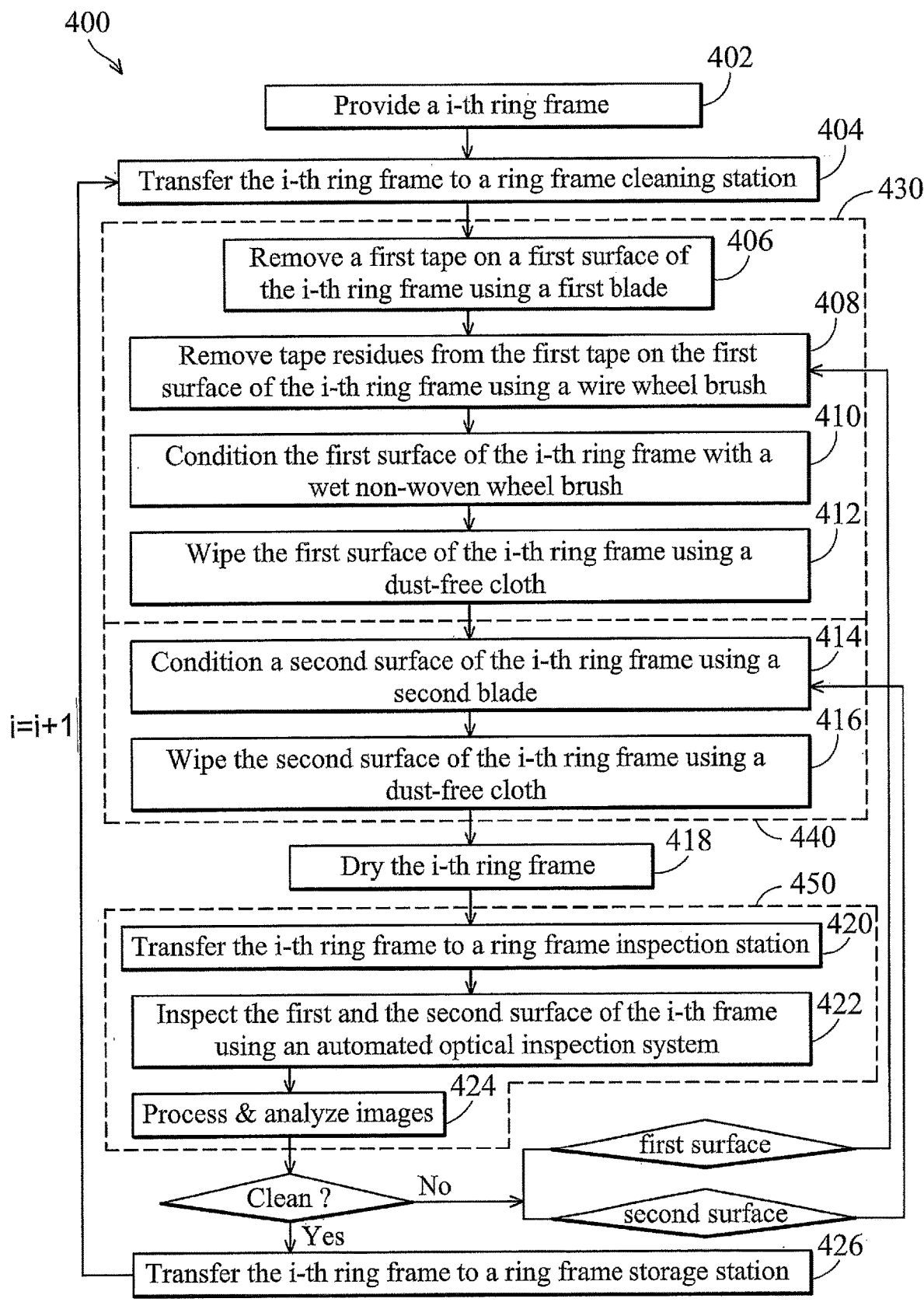
FIG. 4 illustrates a flowchart of a method of cleaning and inspecting ring frames, in accordance with some embodiments of the present disclosure.

FIG. 4 illustrates a flowchart of a method 400 of cleaning and inspecting a ring frame 208, in accordance with some embodiments of the present disclosure. The method 400 comprises two major sub functional blocks performed by a ring frame cleaning station 200 and a ring frame inspection station 300, respectively, as indicated by corresponding dashed lines in FIG. 4. Each station is discussed above in detail in FIGS. 1-3.

The method 400 starts with operation 402 in which an i-th ring frame 208 from a first processing station is provided. In some embodiments, the first processing station comprises operations including wafer dicing/grinding and ring frame removal. In some embodiments, the dicing tape on the bottom surface of the i-th ring frame 208 is further removed in the first processing station.

The method continues with operation 404 in which the i-th ring frame 208 is transferred on a conveyor to a ring frame cleaning station 200. In some embodiments, this conveyor can be a robotic transfer arm, a belt conveyor, and the like, which can provide motions such as, for example horizontal, vertical, linear, rotation, and a combination thereof. In some embodiments, the conveyor can handle a variety of substrates such as, for example, thin, large, or the like. In some embodiments, the conveyor may transfer ring frames between cassettes, stages and/or chambers.

The method continues with operation 406 in which a first tape on a front surface the i-th ring frame 208 is first removed by a first blade 212. In some embodiments, the first tape can be a barcode tape for wafer identification. In some embodiments, the first blade is made of aluminum.

The method continues with operation 408 in which tape residues from the first tape on the front surface of the i-th ring frame 208 is then removed by a metal wire wheel brush 216. Referring to FIG. 2, in some embodiments, the wire wheel brush 216 comprises a circular abrasive brush. In some embodiments, the wires can comprise metal wires with small diameters for fine removal of tape residues 214. In some embodiments, the wires can be made of copper, copper alloys, e.g., bronze, brass, etc, and a combination thereof. In some embodiments, the tape residue 214 can be cleaned by a plurality of wire wheel brushes 216 with different diameters for coarse and fine removal of tape residues 214.

The method 400 continues to operation 410 in which the front surface of the i-th ring frame 208 is further conditioned with a non-woven wheel brush 218. Referring to FIG. 2, in some embodiments, the non-woven wheel brush 218 for surface conditioning comprises materials such as, for example aluminum oxide, silicon carbide, and ceramic. In some embodiments, the non-woven wheel brush 218 can comprise a sanding pad or disc. In some embodiments, the conditioning using a non-woven wheel brush 218 can be performed in a wet condition e.g., water.

The method 400 continues to operation 412 in which the cleaning of the front surface of the i-th ring frame 208 is finished by wiping the front surface with a dust-free cloth 220, such as under wet conditions, according to some embodiments.

The method 400 continues to operation 414 in which dicing tape residues on the back of the i-th ring frame 208 are removed using a second blade 224. Referring to FIG. 2, in some embodiments, the second blade 224 comprises a thermoplastic polymer. In some embodiments, the second blade 224 is made of polyaryletherketone (PAEK), such as polyether ether ketone (PEEK). PEEK offers high strength and excellent resistance to high temperatures allowing an application of heating during the removal of tape residues 222 from the dicing tape. Furthermore, PEEK offers high abrasive wear resistance. The second blade 224 made of PEEK can be made from an injection molding or a machining process due to the great processability of the PEEK material. In some embodiments, the second blade 224 can further comprise carbon fiber, glass fiber, PTFE (polytetrfaluoroethylene) or PEK (polyether ketone) for improved mechanical or thermal properties.

The method 400 continues to operation 416 in which the cleaning of the back surface of the i-th ring frame 208 is finished by wiping the back surface with a dust-free cloth 220 under wet conditions.

The method 400 continues to operation 418 in which the cleaning of the i-th ring frame 208 is finished by wiping both surfaces with a dust-free cloth 220 under wet conditions and drying with clean dry air 226.

The method 400 continues to operation 420 in which the i-th ring frame 208 is transferred to a ring frame inspection station 300 where an automated optical inspection on both surfaces of the i-th ring frame 208 is performed, according to some embodiments.

The method 400 continues to operation 422 in which both front and back surfaces of the i-th ring frame 208 are inspected. In some embodiments, inspection parameters can be first configured. In some embodiment, this configuration includes a process of writing an inspection recipe or recalling an existing recipe to an inspection station 300. In some embodiments, operation 422 also includes configuration of the control circuit 112d which controls the motion of the conveyor, e.g., speed and direction. In some embodiments, inspection parameters include trigger criteria, inspection resolution, line frequency, pixel frequency, total acquisition time, illumination intensity, moving speed of conveyor, size of ring frames, and/or other suitable parameters. Both surface of the i-th ring frame 208 is scanned by a line scan camera 302, while being transported by the conveyor at a constant speed along a direction perpendicular to the line scan direction, as discussed above with respect to FIGS. 3, for example. In some embodiments, the front and back surfaces of the i-th ring frame 208 are scanned by at least two line scan cameras 302 simultaneously.

The method 400 continues to operation 424 in which surface images are processed and analyzed to determine the cleanness of the i-th ring frame 208, according to some embodiments. In some embodiments, a plurality of line scan images are recorded by the light sensor in the line scan camera 302 according to the inspection station 300 illustrated in FIG. 3. In some embodiments, the plurality of line scan images is converted from analog signals to digital signals and stored in a local computer 114d, followed by reconstructing and preprocessing the plurality of line scan images. In some embodiments, the preprocessing includes at least one of the processes such as, for example, offset correction, gain correction, distortion correction, adjusting contrast, and the like.

In some embodiments, the preprocessed surface images can be displayed on a local display monitor which is coupled to a local computer 114d. In some embodiments, the display monitor can be also a touch screen for inputting and displaying inspection parameters. In some embodiments, the preprocessed sample image is compared to references, design criteria and predefined threshold to conduct a mapping of particles by the remote computer 116 so as to determine the particle type and distribution. Results are then transmitted back to the local computer 114d to command the control circuit 112d to control the conveyor so that the first ring frame 208 can be reprocessed, rejected or move on to storage for a next wafer dicing process. In some embodiments, the line speed of the line scan camera is determined by the speed of the conveyor.

In some embodiments, the preprocessed surface images are sent to a remote computer 116. In some embodiments, the surface images are then analyzed to characterize the size and distribution of particles on the surfaces of the first ring frame 208. In some embodiment, sensitivity of the system can be adjusted by the resolution of the camera. In some embodiments, the remote computer 116 can also decide to reject, reprocess or move on the i-th ring frame 208.

The results are then transmitted back to the local computer 114d for display through which a control signal from the control circuit 112d can also be provided back to the conveyor. If the i-th ring frame 208 is determined to be clean and ready for the next wafer dicing process, the method 400 continues to operation 426 in which the first ring frame is transported to a storage station by the conveyor followed by loading a (i+1)-th ring frame by the conveyor to the cleaning station 200 for cleaning. If the i-th ring frame 208 is determined to be unclean such that it has to be re-cleaned, the method 400 continues to operation 408 if the first surface needs to be cleaned or operation 414 if the second surface needs to be cleaned. Accordingly, a chemical-free cleaning and automated optical inspection of ring frames can be achieved.

It should be noted that the method 400 shown in FIG. 4 is an example for illustration purposes and is not intended to be limiting. Operations can be reordered which are within the scope of this invention. In some embodiments, a first cleaning procedure 430 on the first surface comprises operations 406-412 and a second cleaning procedure 440 on the second surface comprises operation 414-416. In some embodiments, an inspection procedure 450 on the first and second surfaces comprises operations 420-424. In some embodiments, the first cleaning procedure 430 on the first surface can be performed after the second cleaning procedure 440 on the second surface. In certain embodiments, the first and the second cleaning procedures 430 and 440 on the first and the second surfaces, respectively can be performed simultaneously before both surfaces are inspected in the inspection procedure 450. In some embodiments, after cleaning the i-th ring frame 208, the next ring frame can be cleaned and cleaned ring frames are stored in a storage station before they are individually inspected in the inspection station.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the inventive concepts, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is set to be understood in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

In an embodiment, a ring frame processing system includes: a cleaning station configured to remove a first tape on a first surface of a ring frame using a first blade, clean first adhesive residues from the first tape on the first surface of the ring frame using a first wheel brush, and remove second adhesive residues from a second tape on a second surface of the ring frame using a second blade; and an inspection station, wherein the inspection station comprises an automated optical inspection system configured to determine the cleanness of the first and second surfaces of the ring frame after cleaning.

In another embodiment, a ring frame processing method includes: removing a first tape on a first surface of a ring frame using a first blade; cleaning first adhesive residues from the first tape on the first surface of the ring frame using a first wheel brush; removing second adhesive residues from a second tape on a second surface of the ring frame using a second blade; and determining the cleanness of the first and second surfaces of the ring frame using an automated optical inspection system.

Yet in another embodiment, a ring frame cleaning system includes: a plurality of blades for mechanically removing tapes and tape residues from surfaces of a ring frame; a plurality of wheel brushes for conditioning the surfaces of the ring frame; and a transport mechanism for transporting the ring frame.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A ring frame cleaning system comprising:
   a cleaning station configured to remove a first tape on a first surface of a ring frame using a first blade, and remove second adhesive residues from a second tape on a second surface of the ring frame using a second blade;
   an inspection station, wherein the inspection station comprises an automated optical inspection system configured to determine a cleanliness of the first and second surfaces of the ring frame;
   a transport mechanism configured to automatically transport the ring frame from the cleaning station to the inspection station;
   a camera configured to scan the first and second surfaces of the ring frame and generate at least one image of each surface; and
   at least one processor configured to receive the at least one image from the camera and analyze the at least one image to detect particles on each surface.

2. The system of claim 1, wherein the transport mechanism is further configured to automatically transport the ring frame from the inspection station to either a storage station if the ring frame is determined to be clean or the cleaning station if the ring frame is determined to be unclean.

3. The system of claim 1, wherein the cleaning station is further configured to clean first adhesive residues from the first tape on the first surface of the ring frame using a first wheel brush, and wherein the first wheel brush is a metal wire wheel brush comprising copper or copper alloys.

4. The system of claim 3, wherein the cleaning station is further configured to condition the first surface of the ring frame using a second wheel brush, wherein the second wheel brush is a non-woven wheel brush, wherein the non-woven wheel brush comprises one of the following: aluminum oxide, silicon carbide, and ceramic.

5. The system of claim 1, wherein the first tape comprises a bar code tape, the second tape comprises a dicing tape, and the second blade comprises polyether ether ketone (PEEK).

6. The system of claim 1, wherein the cleaning station is further configured to
condition the first surface of the ring frame using a second wheel brush;
clean the first and second surfaces of the ring frame using a wet dust-free cloth; and
dry the first and second surfaces of the ring frame using a clean air.

7. A ring frame processing system comprising:
a cleaning station configured to remove a first tape on a first surface of a ring frame and remove a second tape on a second surface of the ring frame;
an inspection station configured to determine a cleanliness of the first and second surfaces of the ring frame after cleaning;
a transport mechanism configured to automatically transport the ring frame from the cleaning station to the inspection station;
a camera configured to scan the first and second surfaces of the ring frame and generate at least one image of each surface; and
at least one processor configured to receive the at least one image from the camera and analyze the at least one image to detect particles on each surface,
wherein the cleaning station is configured to remove the first tape on the first surface of the ring frame using a first blade, clean first adhesive residues from the first tape on the first surface of the ring frame using a first wheel brush, and remove second adhesive residues from the second tape on the second surface of the ring frame using a second blade.

8. The system of claim 7, wherein the first tape is the barcode tape and the second tape is a dicing tape.

9. The system of claim 7, wherein the transport mechanism is further configured to automatically transport the ring frame from the inspection station to either a storage station if the ring frame is determined to be clean or back to the cleaning station if the ring frame is determined to be unclean.

10. The system of claim 7, wherein the first wheel brush is a metal wire wheel brush, comprising copper or copper alloys.

11. The system of claim 7, wherein the cleaning station is further configured to condition the first surface of the ring frame using a second wheel brush, wherein the second wheel brush is a non-woven wheel brush, wherein the non-woven wheel brush comprises one of the following: aluminum oxide, silicon carbide, and ceramic.

12. The system of claim 7, wherein the second blade comprises polyether ether ketone (PEEK).

13. A ring frame cleaning system comprising:
a cleaning station configured to remove a first tape on a first surface of a ring frame using a first blade, and remove second adhesive residues from a second tape on a second surface of the ring frame using a second blade;
an inspection station, wherein the inspection station comprises an automated optical inspection system configured to determine a cleanliness of the first and second surfaces of the ring frame;
a transport mechanism configured to automatically transport the ring frame from the cleaning station to the inspection station, wherein the transport mechanism is further configured to automatically transport the ring frame from the inspection station to either a storage station if the ring frame is determined to be clean or the cleaning station if the ring frame is determined to be unclean;
a camera configured to scan the first and second surfaces of the ring frame and generate at least one image of each surface; and
at least one processor configured to receive the at least one image from the camera and analyze the at least one image to detect particles on each surface.

14. The system of claim 13, wherein the plurality of blades comprises at least one aluminum blade, and at least one PEEK (polyether ether ketone) blade.

15. The system of claim 13, wherein the plurality of wheel brushes comprises at least one copper wire wheel brush and at least one non-woven wheel brush.

16. The system of claim 15, wherein the at least one non-woven wheel brush comprises at least one of the following: aluminum oxide, silicon carbide, and ceramic.

17. The system of claim 13, wherein the plurality of blades comprises:
a first blade configured to remove a first tape on a first surface of a ring frame; and
a second blade configured to remove adhesive residues from a second tape on a second surface of the ring frame.

18. The system of claim 17, wherein the first tape is a barcode tape and the second tape is a dicing tape.

19. The system of claim 17, wherein the plurality of wheel brushes comprises a first wheel brush configured to clean adhesive residues from the first tape on the first surface of the ring frame.

20. The method of claim 19, wherein the first wheel brush is a metal wire wheel brush, comprising copper or copper alloys.

* * * * *